United States Patent [19]

Khan et al.

[11] Patent Number: 4,777,017

[45] Date of Patent: Oct. 11, 1988

[54] LOW DENSITY NICKEL BASED SUPERALLOY

[75] Inventors: Tasadduq Khan, Jouy en Josas; Pierre Caron; Jean-Louis Raffestin, both of Les Ulis, all of France

[73] Assignee: Office National d3 Etudes et de Recherches Aerospatiales (ONERA), Chatillon, France

[21] Appl. No.: 878,401

[22] Filed: Jun. 20, 1986

Related U.S. Application Data

[63] Continuation of Ser. No. 672,574, Nov. 16, 1984, abandoned.

[30] Foreign Application Priority Data

Nov. 18, 1983 [FR] France ................................ 83 18421

[51] Int. Cl.$^4$ .................................................. C22C 19/05
[52] U.S. Cl. .................................... 420/448; 148/162; 148/404; 148/410; 148/428
[58] Field of Search ................ 148/404, 410, 428, 162; 420/448

[56] References Cited

FOREIGN PATENT DOCUMENTS

2512837  3/1983  France .
2503188  5/1983  France .
2106138  4/1983  United Kingdom .

*Primary Examiner*—R. Dean
*Attorney, Agent, or Firm*—Herbert Dubno

[57] ABSTRACT

A low density nickel based superalloy having good creep characteristics when hot, and intended in particular for making turbomachine parts by monocrystalline solidification, wherein the composition of the alloy in percentages by weight is as follows:

| Co: | 5% to 7% | Cr: | 5% to 10% | Mo: | 0.5% to 2.5% |
| W: | 3% to 5% | Al: | 6% to 7.5% | Ti: | 1.5% to 2.25% |
| Nb: | 0% to 0.5% | Ta: | 2% to 4% | V: | 0.3% to 0.6% |
| Ni: | balance to 100%. | | | | |

Parts, e.g. turbomachine blades, made from the alloy.

2 Claims, 3 Drawing Sheets

FIG.3

| TEMPERATURE (°C) | STRESS (MPa) | CREEP TIME t (hours) | ALLOY DS200+Hf (PWA 1422) DEN = 8.55 | ALLOY (PWA 1480) DEN = 8.70 | ALLOY EXAMPLE 1 DEN = 8.23 | ALLOY EXAMPLE 2 DEN = 8.20 |
|---|---|---|---|---|---|---|
| 760 | 750 | t TO 1% DEFORMATION | 10h | 60h | 72h | 37h |
|  |  | t TO RUPTURE | 60 to 150h | 630h | 847h | 550h |
| 850 | 500 | t TO 1% DEFORMATION | 40h | 60h | 111h | 84h |
|  |  | t TO RUPTURE | 100h | 183h | 331h | 280h |
| 950 | 240 | t TO 1% DEFORMATION | 45h | 115h | 100h | 105h |
|  |  | t TO RUPTURE | 170h | 270h | 250h | 250h |
| 1050 | 120 | t TO 1% DEFORMATION | 32h | 182h | 260h | 151h |
|  |  | t TO RUPTURE | 100h | 335h | 400h | 260h |

CREEP CHARACTERISTICS

LOW DENSITY NICKEL BASED SUPERALLOY

This is a continuation of co-pending application Ser. No. 672,574 filed on Nov. 16, 1984, abandoned.

FIELD OF THE INVENTION

The present invention relates to a particular nickel based superalloy composition suitable for monocrystalline solidification, in particular for making moving blades of turbomachines.

OBJECT OF THE INVENTION

The object of the invention is to provide an alloy which, by comparison with the highest performance superalloys presently available, is of lower density while having a better specific creep characteristics (expressed as the resistance to creep when hot divided by density) than these superalloys.

BACKGROUND OF THE INVENTION

The highest performance superalloy currently in production is one identified as PWA 1422 (DS 200+Hf); its density is 8.55 g/cm³ (grams per cubic centimeter). This alloy has columnar grains which are obtained by directional solidification giving high resistance to forces in a direction parallel to the grain boundaries.

Much work is currently in progress to devise new compositions suitable for making monocrystalline blades by directional solidification.

One of the best alloys of this type which has been proposed, is identified as PWA 1480 (or alloy 454), and its density is 8.7 g/cm³.

The creep resistance of this alloy, by comparison to the above-mentioned columnar grain alloy (PWA 1480), provides an improvement of 20° C. to 50° C. (depending on the temperature range under consideration).

This property stems from the composition of the alloy PWA 1422 and also from precipitation heat treatments applied to the parts made from the alloy after monocrystalline solidification, e.g. the treatments described in the commonly owned French patent application published under the U.S. Pat. No. 2,503,188 in which a γ' phase is precipitated with an average crystal size of 5,000 Ångströms.

However, for alloys that are intended to constitute the moving blades of turbomachines, only the specific creep characteristics are really important in practice, bearing in mind that the density of the alloy must be as low as possible to minimize centrifugal stress on the moving blades of turbomachines.

It is currently accepted that an increase of about 10% in density leads to a reduction in the usefulness of a disk on which the blades are mounted by a factor of 3.

Conversely, a reduction in density leads to a lighter blade-disk assembly, thereby improving turbomachine performance.

However, up to the present, the density of known low creep monocrystalline superalloys has been about 8.6 g/cm³.

One aim of the present invention is to provide an alloy composition which enables monocrystalline parts to be obtained having specific creep characteristics which are better than those of the alloy 454, but for which the density does not exceed 8.25 g/cm³, i.e. showing an improvement of about 5% over the said known alloy.

In general, improved resistance to creep when hot is obtained by massive addition of refractory elements such as Ta, W, and Mo or Re.

Thus the strongest monocrystalline alloy now being used industrially (alloy 454) contains 12% Ta and 4% W.

Similarly the alloy DS 200+Hf contains 12% W.

These refractory elements play an important part in reducing the rate of creep, and correspondingly in increasing useful operating life.

These elements have very low diffusion rates, even at high temperatures, thereby slowing down the coalescence rate of the γ' phase, i.e. the hardening phase Ni³ (Al, Ti, ...) on which the alloy's resistance to creep when hot depends.

However, these refractory elements are very heavy, and while they do effectively increase the resistance to creep when hot, they also have the drawback of simultaneously increasing the density of the alloy.

It may be thought that the density of the alloy can be reduced by adding large quantities of light elements such as aluminum, but this leads to primary precipitation of the γ' phase and the alloy thus does not have the required creep characteristics.

SUMMARY OF THE INVENTION

Work performed by the Applicant on superalloys for turbomachine blades has led to the determination on the one hand of a sum $S_1$ relating to the refractory elements, i.e.:

$$S_1 = 0.5W + Ta + Mo$$

wherein the literal symbols represent the fraction by weight of the corresponding chemical elements and on the other hand, a sum $S_2$ relating to elements which participate in the formation of the hardening γ' phase, i.e.:

$$S_2 = Al + Ti + Ta + Nb + V$$

wherein the symbols represented in the factor are numbers of atoms of the elements.

The applicants have determined, taking into account the conflicting requirements of low density and high resistance to creep, that the conditions to be complied with by the values of $S_1$ and $S_2$ in order to obtain alloys with optimal quality are as follows:

$S_1$ lies in the range 4% to 9% by weight and preferably in the range 5.5% to 9%;

$S_2$ lies in the range 14.9% to 20.6% by number of atoms, and preferably in the range 16.5% to 18.5%.

The vanadium in the sum $S_2$ widens the heat treatment window, i.e. the temperature gap between the end of the γ' phase going into solution and the point at which the alloy starts melting, which is advantageous for heat treatment under industrial conditions.

C, B and Zr are not incorporated in the alloy, thereby preventing a reduction in the temperature at which the alloy begins to melt, which makes it possible during heat treatment to raise the parts to a high enough temperature for the γ' phase to be returned to solution together with nearly all of the γ/γ' eutectic, all of which is subsenquently precipitated during cooling in the form of fine γ' particles.

An alloy in accordance with the invention complying with the above conditions for $S_1$ and $S_2$ has a composition corresponding to the following table, wherein the proportions are expressed in weight percentages:

| Co: | 5% to 7% | Cr: | 5% to 10% | Mo: | 0.5% to 2.5% |
|---|---|---|---|---|---|
| W: | 3% to 5% | Al: | 6% to 7.5% | Ti: | 1.5% to 2.25% |
| Nb: | 0% to 0.5% | Ta: | 2% to 4% | V: | 0.3% to 0.6% |
| Ni: | balance to 100%. | | | | | without any intentional addition of B, C, or Zr.

After a monocrystalline blade has been made, it is subjected to heat treatment to put the γ' phase into solution. This treatment consists in heating the part to a temperature in the range 1290° C. to 1325° C. (depending on its composition) for a period of time in the range 30 minutes to 4 hours.

The part is then cooled in air. The γ' phase precipitation heat treatment as defined in French patent publication No. 2,503,188 filed Apr. 3rd, 1981 is then applied i.e. the γ' phase is precipitated by heat treatment at a temperature above 1060° C. for several hours.

This ensures a regular distribution of γ' particles having an average size of 0.5 μm.

These particles are aligned along <100> type crystallographic axes.

DETAILED DESCRIPTION OF SPECIFIC EXAMPLES

Example 1

The alloy composition is as follows:

| Co: | 5% | Cr: | 7% | Mo: | 2.25% |
|---|---|---|---|---|---|
| W: | 4% | Al: | 6% | Ti: | 2% |
| Nb: | 0% | Ta: | 4% | V: | 0.5% |
| Ni: | balance to 100% | | | | |

The density of this alloy is 8.23 g/cm$^3$.

The temperature for total dissolution of the γ' phase is about 1295° C.

The temperature at which the alloy begins to melt is about 1317° C.

The relatively large difference (22° C.) between these two temperatures (i.e. the heat treatment window) is considerably greater than that of known monocrystalline alloys.

The presence of vanadium in conjunction with the other elements, although in a very small amount (0.5%), leads to excellent resistance to creep at very high temperatures.

Example 2 the alloy composition is as follows:

| Co: | 5% | Cr: | 7% | Mo: | 2.25% |
|---|---|---|---|---|---|
| W: | 4% | Al: | 6% | Ti: | 2% |
| Nb: | 0.5% | Ta: | 3% | V: | 0.5% |
| Ni: | balance to 100%. | | | | |

The density of this alloy is 8.20 g/cm$^3$.

The temperature for total dissolution of the γ' phase is about 1290° C. The temperature at which the alloy begins to melt is about 1310° C. The heat treatment window is 20° C.

In other compositions according to the invention which have been tried, the heat treatment windows are always more than 10° C.

BRIEF DESCRIPTION OF THE DRAWING

FIG. 3 is a table of creep characteristics.

SPECIFIC DESCRIPTION

Figure 1:
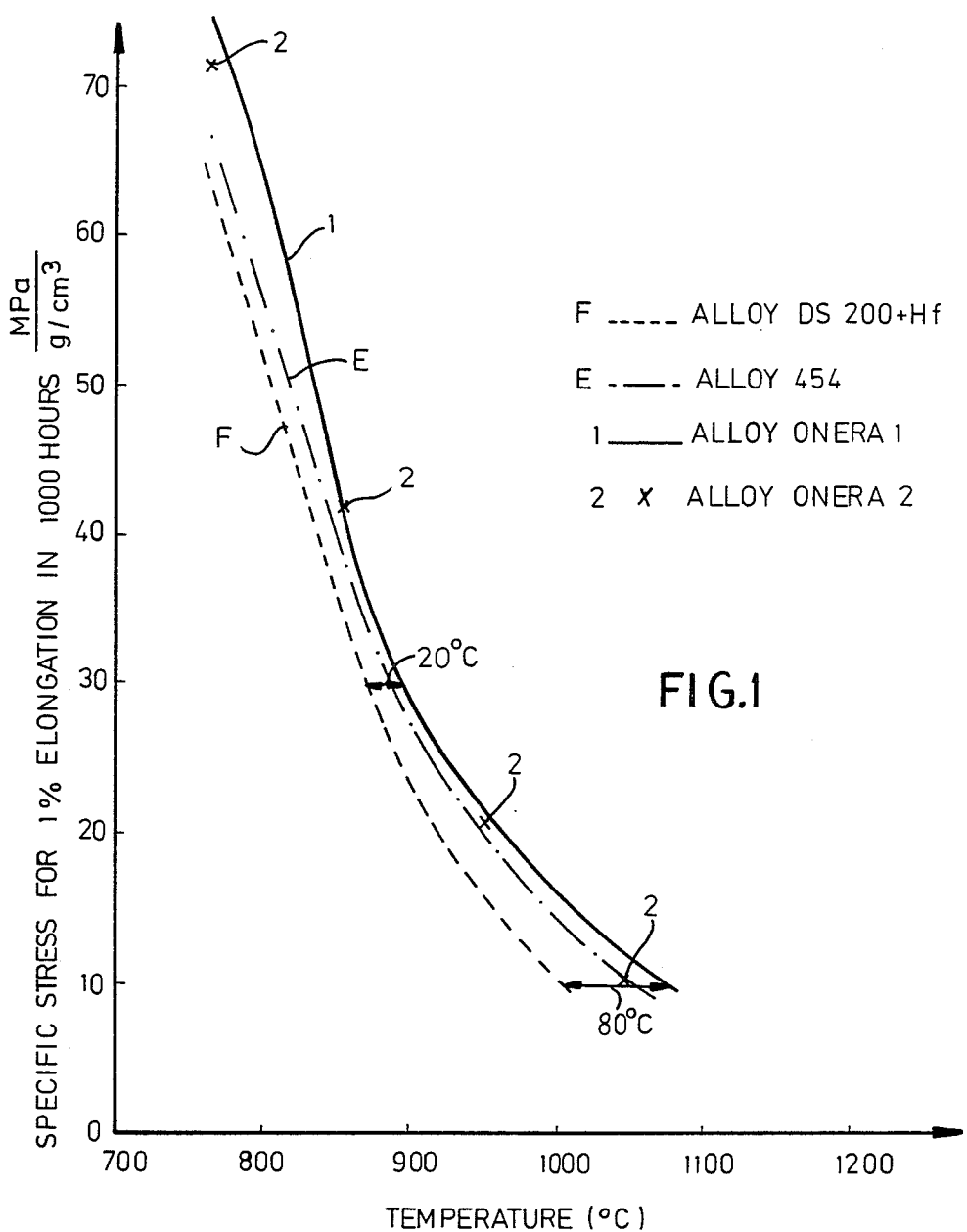
FIGS. 1 and 2 are graphs comparing the resistance to creep when hot of the alloys of examples 1 and 2 with the best prior art alloys, namely:
alloy E=PWA 1480 or alloy 454; and
alloy F=PWA 1422 or DS 200+Hf.
Figure 2:
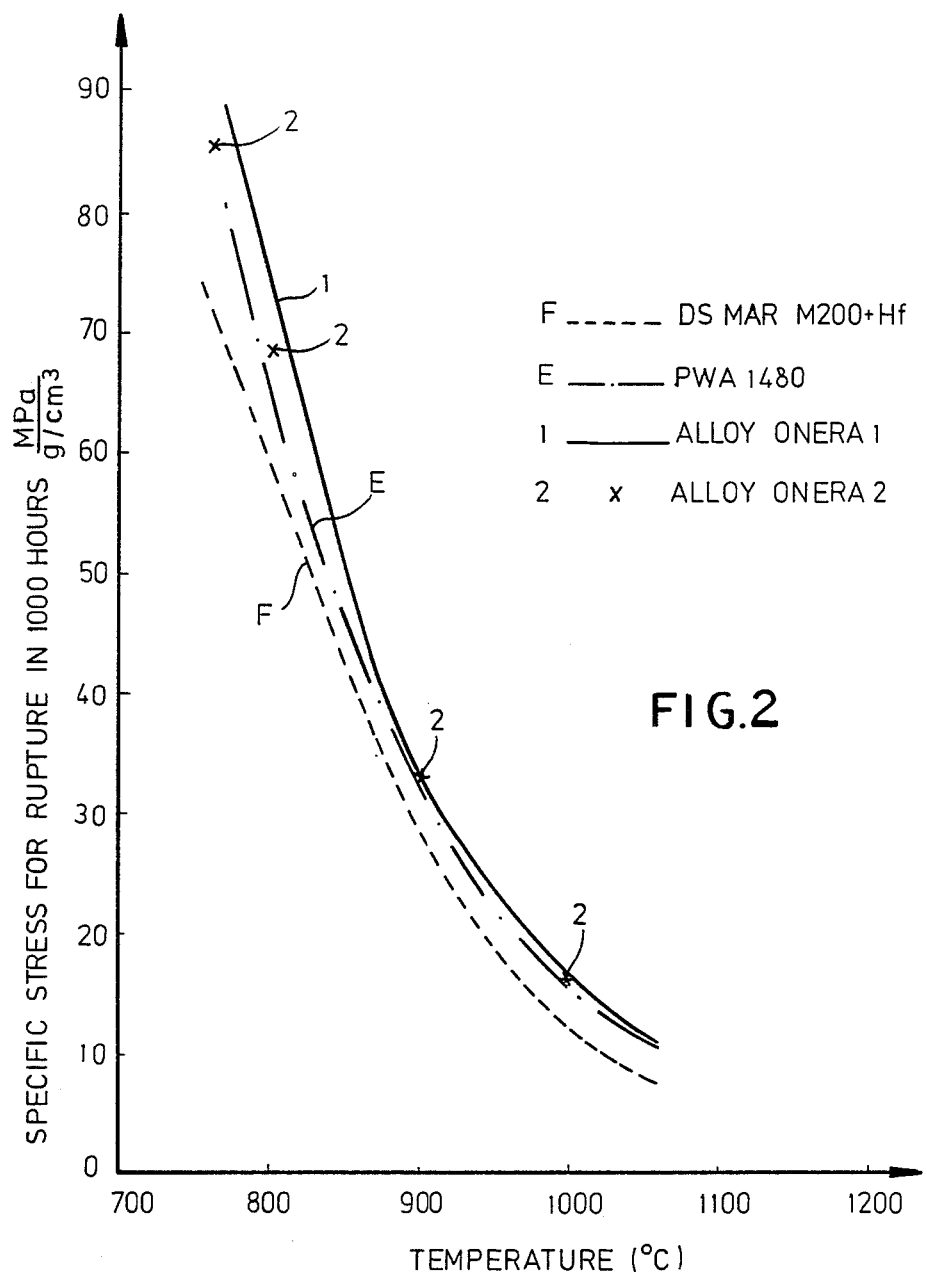

FIG. 1 is a graph in which the specific stress, i.e. stress divided by density, required to obtain a 1% elongation after 1000 hours, is plotted as a funtion of temperature in °C. for the four above-mentioned alloys. FIG. 2 is a similar graph showing the specific stress required for rupture at 1000 hours.

In the graphs curve 1 represents results obtained on a test piece of the example 1 alloy after being subjected to the heat treatment defined in the said French patent specification No. 2,503,188.

Crosses 2 represents the equivalent results obtained on the alloy of example 2 after being subjected to the same treatment.

Curve E represents the results obtained on a test piece of alloy 454 and curve F represents the results obtained on a test piece of the columnar grain alloy DS 200+Hf.

It may be observed that over the entire range of temperatures to be found in use, both of the example alloys provide superior characteristics to either of the prior art alloys.

With reference to FIG. 1, it can be seen that the Example 1 alloy provides a 20° C. improvement over the alloy DS 200+Hf at a temperature of around 900° C. At a temperature of around 1000° C. it provides an improvement of 80° C.

The Example 1 alloy further has the advantage of a considerably reduced density, i.e. 8.23 g/cm$^3$ rather than 8.55 g/cm$^3$ for the alloy DS 200+Hf.

In comparison with the monocrystalline alloy 454 whose density is 8.70 g/cm$^3$, alloy 1 has considerably superior creep performance at temperature of less than 850° C. and slightly better performance at temperatures above 950° C.

Alloys in accordance with the invention are thus shown to have superior creep characteristics to previously known alloys.

FIG. 3 is a table for the above-mentioned prior art alloys and for the alloys of the two present examples showing the effect of various temperatures and specific stresses in terms of the time taken to reach 1% elongation and to reach rupture.

Even without taking account of the advantages which result from the low density of the alloys in accordance with the invention, the alloy of example 1 resists creep just as well as alloy 454 at medium temperatures (up to 950° C.) and considerably better at high temperatures.

Further, the reduced density provides a mass saving for the blade-disk assembly which increases the performance of a turbomachine equiped with such a lightened blade-disk assembly.

Thus a density reduction of 5% as obtained by the compositions of the present invention has a significant effect in this respect.

What is claimed is:

1. A low density nickel based superalloy having a density of 8.23 g/cm³, good creep characteristics when hot, and strong resistance to rupture, for making turbomachine parts by microcrystalline solidification, said composition consisting in percentages by weight essentially of:

| Co: | 5% | Cr: | 7% | Mo: | 2.25% |
|---|---|---|---|---|---|
| W: | 4% | Al: | 6% | Ti: | 2% |
| Ni: | balance to 100%. | Ta: | 4% | V: | 0.5% |

2. A low density nickel based superalloy having a density of 8.20 g/cm³, good creep characteristics when hot, and strong resistance to rupture, for making turbomachine parts by microcrystalline solidification, said composition consisting in percentages by weight essentially of:

| Co: | 5% | Cr: | 7% | Mo: | 2.25% |
|---|---|---|---|---|---|
| W: | 4% | Al: | 6% | Ti: | 2% |
| Nb: | 0.5% | Ta: | 3% | V: | 0.5% |
| Ni: | balance to 100%. | | | | |

* * * * *